United States Patent [19]

Green et al.

[11] Patent Number: 5,586,004

[45] Date of Patent: Dec. 17, 1996

[54] MOUNTING ASSEMBLY FOR POWER SEMICONDUCTORS

[75] Inventors: Ross M. Green; Michael J. Kellaway, both of Cambridge; David J. Shemmans; David J. McShane, both of Herts, all of England

[73] Assignee: Wavedriver Limited, Royston, England

[21] Appl. No.: 464,739

[22] PCT Filed: Jan. 20, 1994

[86] PCT No.: PCT/GB94/00110

§ 371 Date: Jun. 22, 1995

§ 102(e) Date: Jun. 22, 1995

[87] PCT Pub. No.: WO94/17649

PCT Pub. Date: Aug. 4, 1994

[30] Foreign Application Priority Data

Jan. 20, 1993 [GB] Great Britain ............ 9301049

[51] Int. Cl.$^6$ ............................................. H05K 7/20
[52] U.S. Cl. .................. 361/699; 165/80.3; 257/714; 361/715
[58] Field of Search ............ 165/80.3, 104.33, 165/125, 903; 257/714; 361/688–690, 694–699, 702, 704, 707, 710–711, 715, 728, 730, 731, 735, 792

[56] References Cited

U.S. PATENT DOCUMENTS

| | | | |
|---|---|---|---|
| 3,277,346 | 10/1966 | McAdam et al. | 361/697 |
| 4,880,050 | 11/1989 | Nakamura et al. | 361/701 |
| 5,063,475 | 11/1991 | Balan | 361/692 |

FOREIGN PATENT DOCUMENTS 71186656   7/1982   Japan.

*Primary Examiner*—Gregory D. Thompson
*Attorney, Agent, or Firm*—Watson Cole Stevens Davis, P.L.L.C.

[57] ABSTRACT

A mounting assembly for power semiconductors comprises a plurality of modules (20) arranged in a symmetrical arrangement around a central axis. Each module has one or more heat sink substrate surfaces (201,203) for the mounting of semiconductor components (205) and an internal passage (202) for passing a fluid cooling medium therethrough in order to cool the semiconductor components. The assembly may comprise a prismatic body (24) providing the substrate surfaces (243).

15 Claims, 7 Drawing Sheets

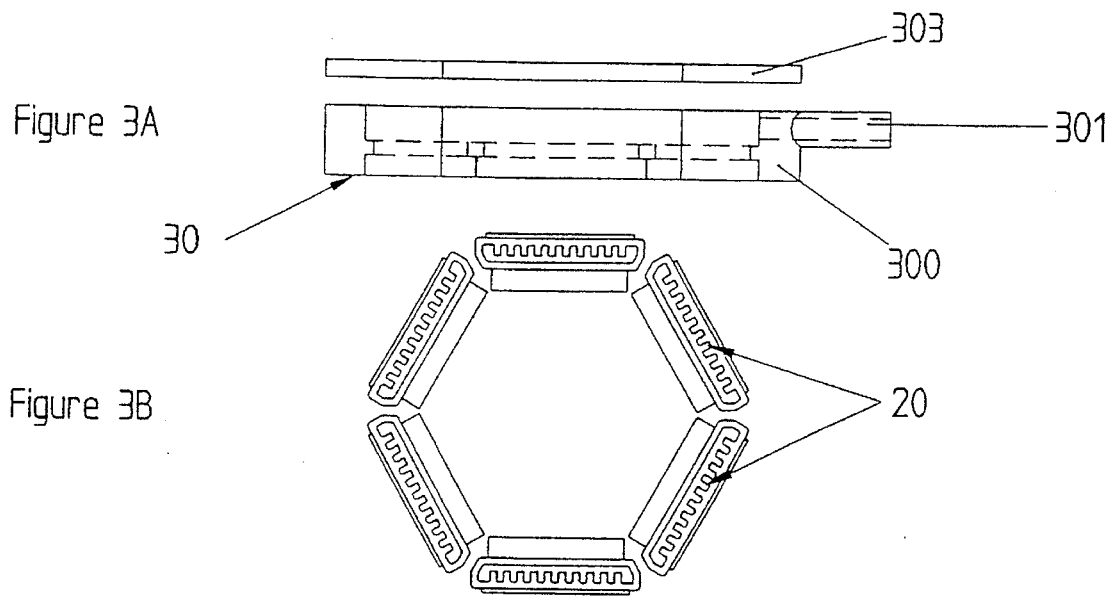
Figure 3A
Figure 3B
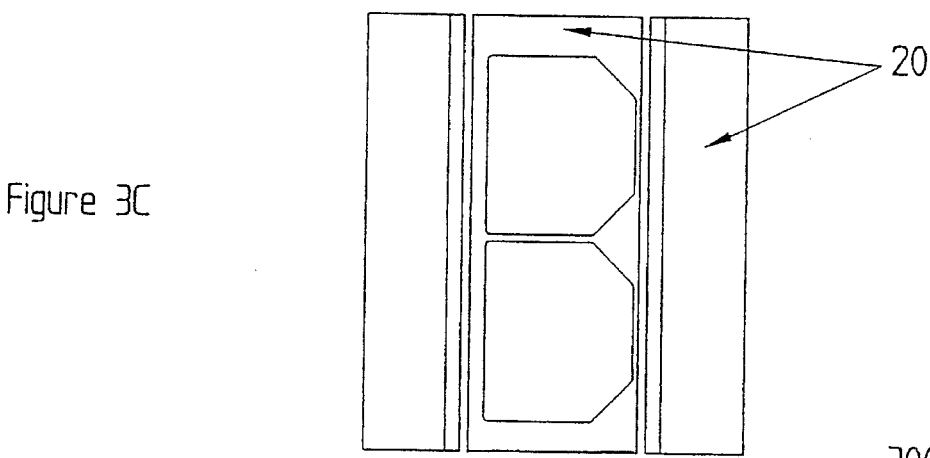
Figure 3C
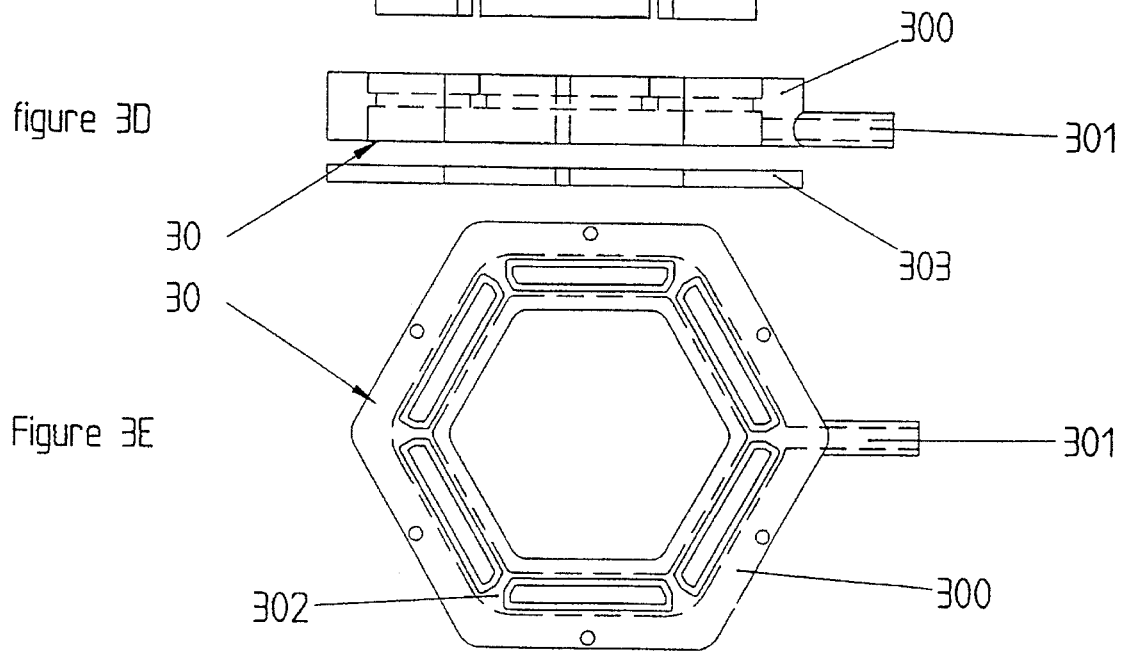
figure 3D
Figure 3E

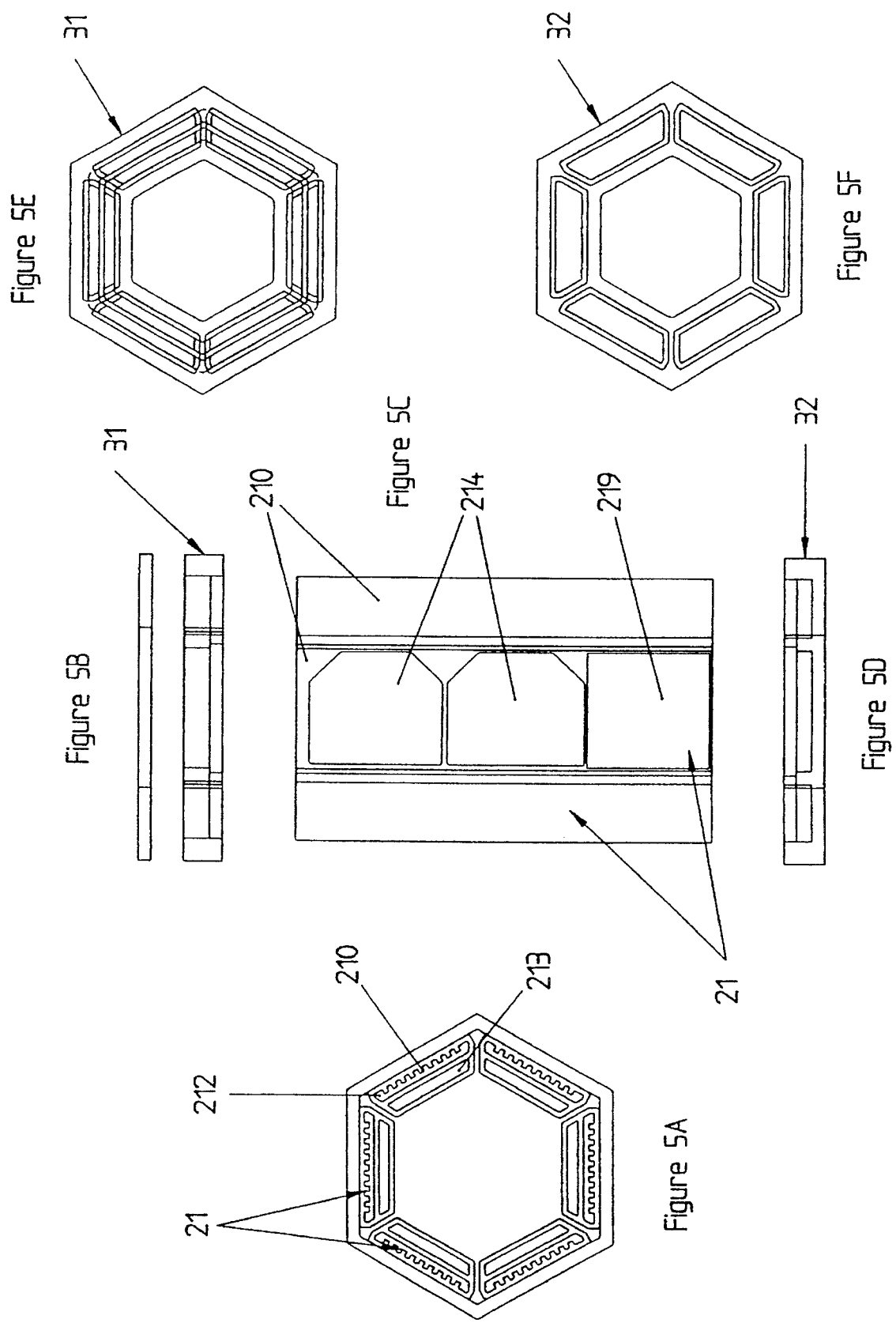

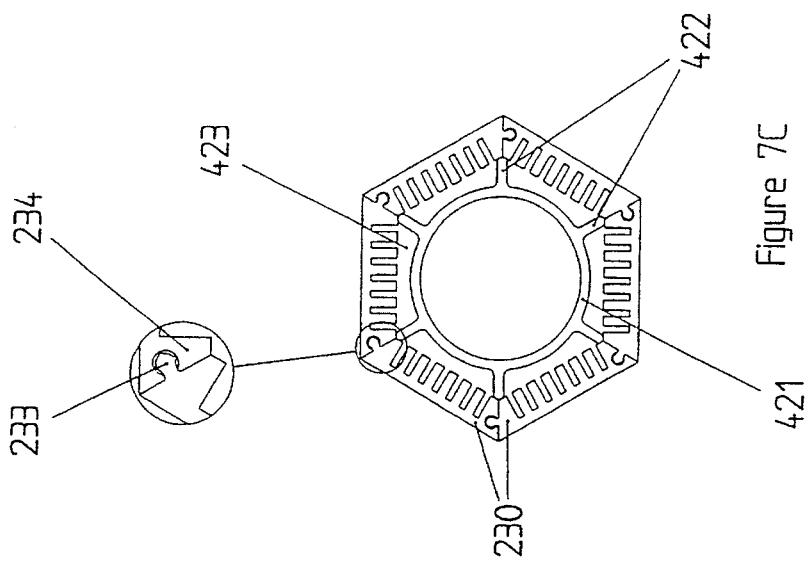
Figure 7C
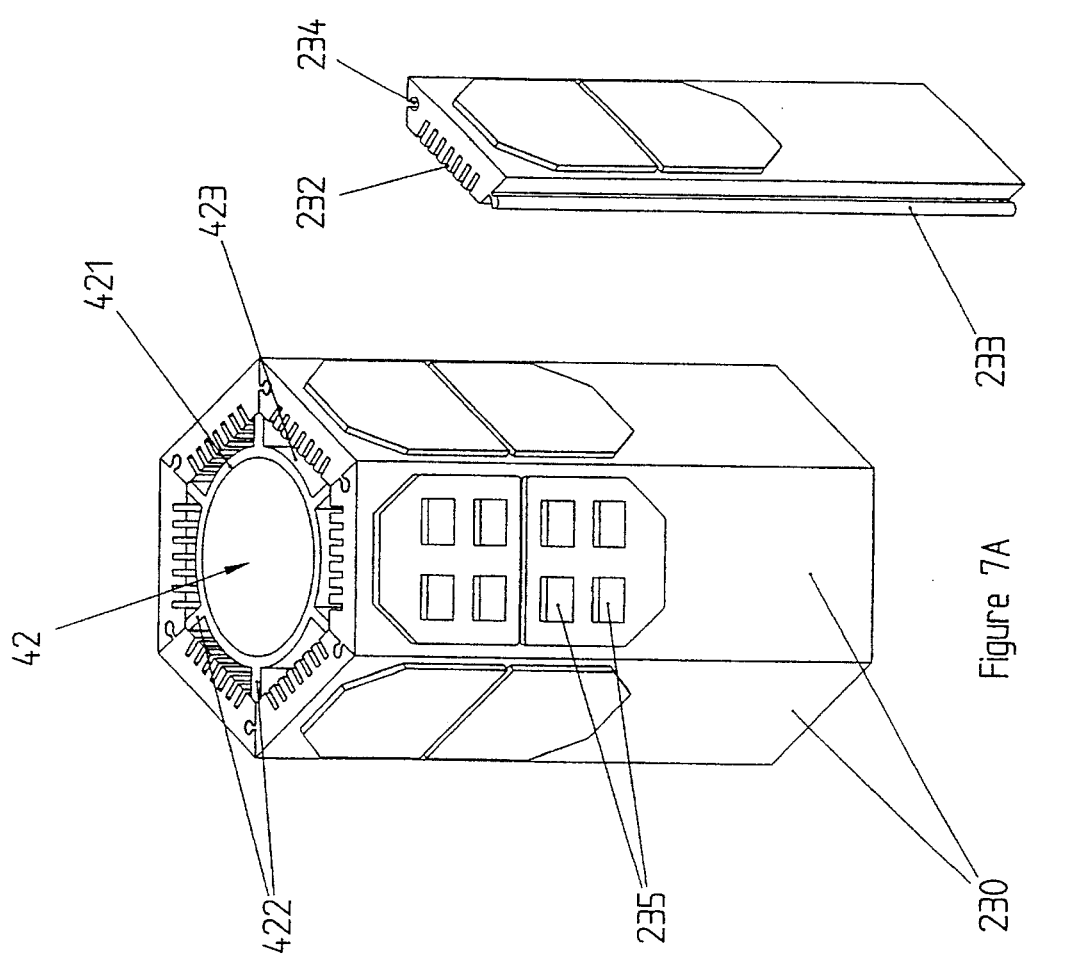
Figure 7B
Figure 7A

MOUNTING ASSEMBLY FOR POWER SEMICONDUCTORS

The present invention relates to a mounting assembly for power semiconductors, particularly semiconductors for vehicle electric drive power electronics and, more particularly, to an assembly which provides for efficient cooling of the semiconductors of such drive components.

EP-A-0 447 819 discloses a cooling system for heat-generating semiconductors, which comprises plural levels of components arranged in a symmetrical fashion on shelf-like supports around central ducts arranged in a coaxial fashion and through which a cooling medium is directed so as to flow across the surfaces of the semiconductors to cool them. Cooling is achieved by convection. FR-A-2 571 546 discloses a number of heat sink constructions for electronic components, one of which (FIG. 5) suggests positioning the component internally of a cylindrical, finned heatsink. Patent Abstracts of Japan, vol. 6, no. 215 (E-138) & JP-A-57 118656 discloses mounting LSI circuits in a heat sink frame for cooling by a fan within the frame.

In our International patent application no. PCT/GB92/01435 (WO93/02887) we describe an "electric-hybrid" (EH) type vehicle, having a main electric drive and an auxiliary internal combustion engine (AICE) drive, which includes an integrated liquid cooling/heating system for the electric drive power supply and the auxiliary internal combustion engine (AICE), whereby heat removed from the electric drive power supply can be supplied to the auxiliary internal combustion engine to pre-heat it.

The present invention is intended to provide a mounting assembly suitable for use in such a system as well as in other applications where efficient cooling of semiconductor components is required. Such a system includes power and control electronics as well as busbars and terminals for feeding electric current to and from the drive motor and, where the drive system is multi-phase, has a corresponding multiplicity of identical components. It is important to provide the electric drive in as symmetrical a form as possible, and this includes conductor lengths, cooling, etc.

According to the present invention, there is provided a power electronics assembly having a mounting assembly for power semiconductors and a plurality of power semiconductors mounted thereon, the mounting assembly comprising a prismatic body and an internal passage for passing a fluid cooling medium therethrough in order to cool the body and the semiconductors, characterised in that the prismatic body has one or more substrate surfaces on which the semiconductors are directly mounted. In this specification the term "prismatic" includes, for example, a circular cylindrical structure having flat, machined side surfaces, as well as shapes which are inherently prismatic by manufacture, such as hexagonal cylinders and the like.

By means of such an assembly, near perfect symmetry can be achieved for, for example, three-phase drive systems or similar, not only as regards geometrical layout, but also cooling, so that all identical components can be equally cooled.

According to a further aspect of the invention there is provided a mounting assembly for power semiconductors, the assembly comprising a plurality of modules arranged in a symmetrical arrangement around a central axis, each module comprising one or more heat sink substrate surfaces for the mounting of semiconductor components and an internal passage for passing a fluid cooling medium therethrough in order to cool the semiconductor components. The assembly may thus provide a prismatic arrangement to which connections can be made symmetrically.

Two heat sink substrate surfaces may be formed, one on each side of each module, by forming the module with a heat sink of an aluminium or copper (for example) extrusion or assembly providing an internal passage for coolant fluid. Such an arrangement has the additional advantage of reducing the overall length of the assembly and hence the space occupied.

The individual modules may be combined into the assembly by being retained in a pair of end manifolds feeding coolant fluid to and from the internal passages.

The body may alternatively be a hollow copper structure assembled from a plurality of identical flat plates mounted on a supporting core, the core providing a central passageway for a cooling fluid (gaseous or liquid). The core may be substantially cylindrical, having a number of radial flanges between which the individual plates are disposed. The plates and flanges may have mating surfaces profiled to provide a sliding fit of the plates along the axial direction of the flanges and to enable a fluid tight seal to be established between the plates and the flanges. Each of the plates preferably has a contoured rear (radially inner after mounting) surface so as to provide an increased surface area over which coolant may flow in order to increase cooling. The contours may be in the form of elongate channels which extend in the axial direction of the core. To provide a secure fit of the plates within the flanges, the flanges may have elongate ribs which mate with corresponding grooves on the edges of the plates and may have similarly elongate lips to retain the plates on the core, spaced from the central cylinder of the core and thus providing channels for coolant between the cylindrical part of the core and the rear of the plates.

In a further alternative construction, the plates may interlock to provide the body without being interengaged with the core, the core having flanges, the edges of which are sealed to the junctions of the plates to provide the cooling passages.

Each of the above constructions enables existing semiconductor-mounting equipment to be utilised without significant adaption. In a further embodiment, which may be advantageous in manufacture of the body, but which would require adaption of semiconductor mounting techniques, the body is a hollow aluminium (or other metal) member in which are provided individual passageways closely adjacent to the substrate surfaces and forming a manifold like assembly by means of which equal flows of cooling fluid may be provided to like components mounted symmetrically on the substrate surfaces.

In all cases, the body may also provide for the mounting of the required busbars needed for current distribution to and from the motor.

The invention provides a system having very low thermal resistance between the semiconductors and the cooling fluid (through the heat sink walls of the prismatic body and modules), the ability to locate gate-drive components for controlling the main switching semiconductors close to the cooling medium and in close proximity to the main switches, reduces the total number of components which needs to be used, reduces manufacturing costs, and minimises the size of the assembly and enables close control of the power device temperatures.

Additionally, no basically new manufacturing processes have to be adopted, and conventional techniques are involved in the assembly of the drive semiconductors onto the surfaces of the prismatic body, each face being rotated in turn into the desired position, or, in the alternative, on to the surfaces of the individual modules before these are assembled into the manifolds.

Examples of assemblies according to the present invention, each of which is described in context of a vehicle electric drive, will now be described with reference to the accompanying drawings, in which.

Figure 1:
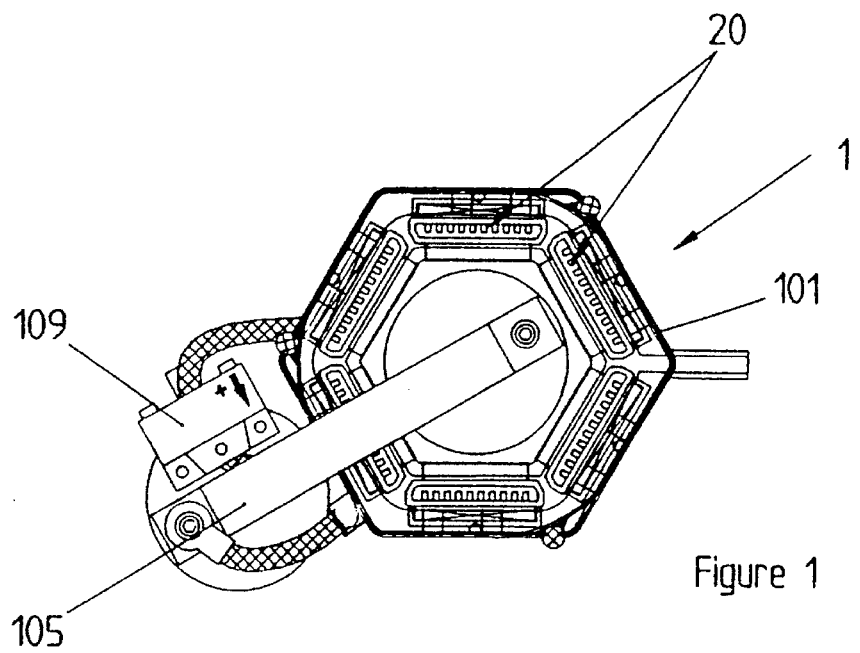
FIG. 1 is a plan view of a first assembly.
Figure 2:
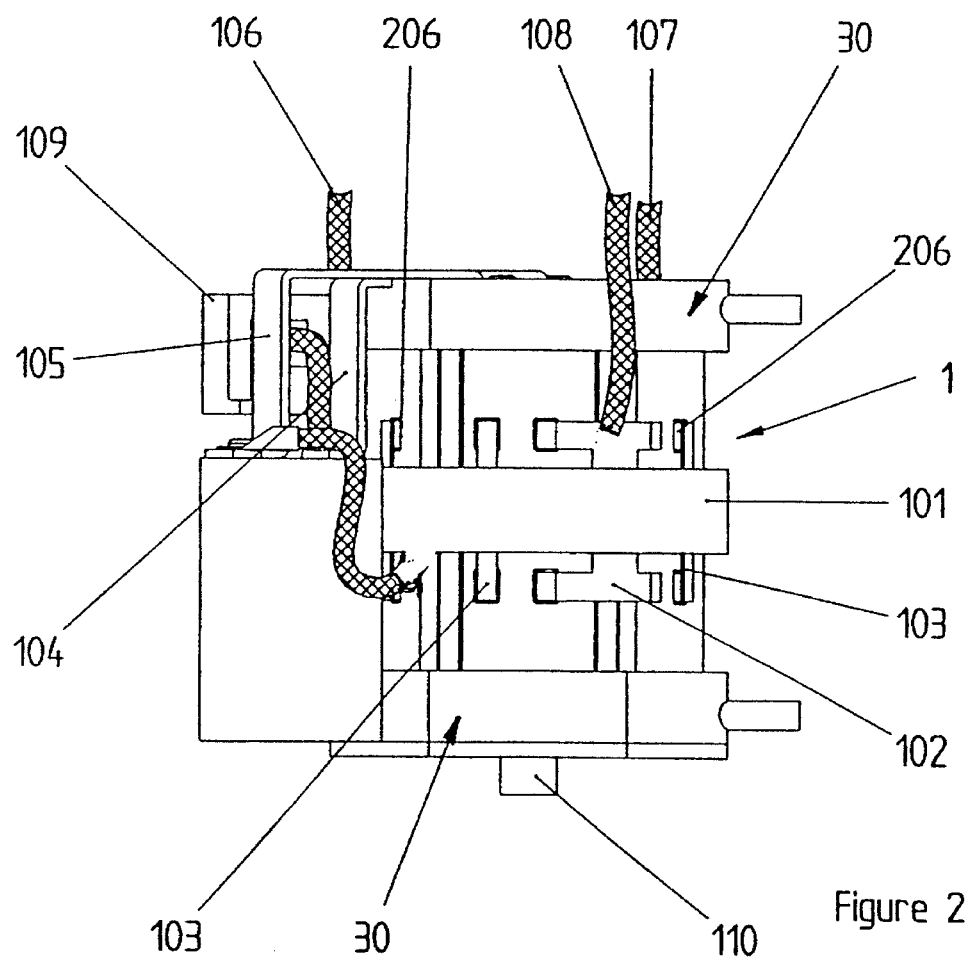
FIG. 2 shows a side view of the assembly of FIG. 1.
Figure 4:
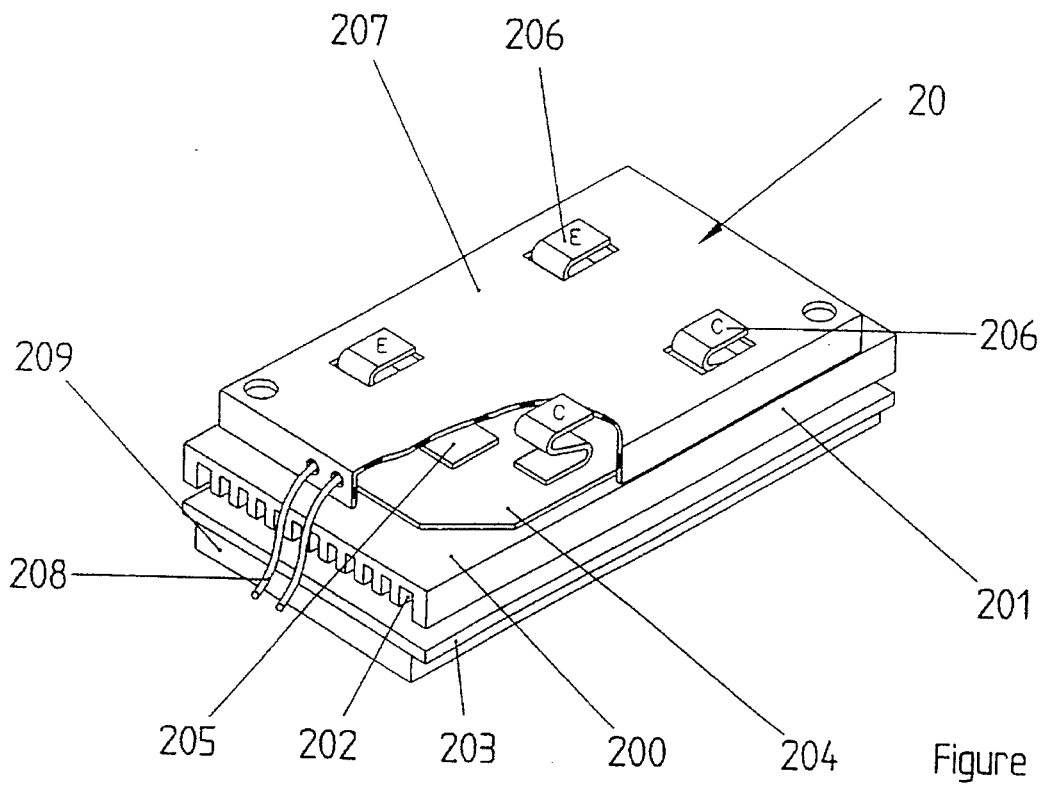
Figure 6:
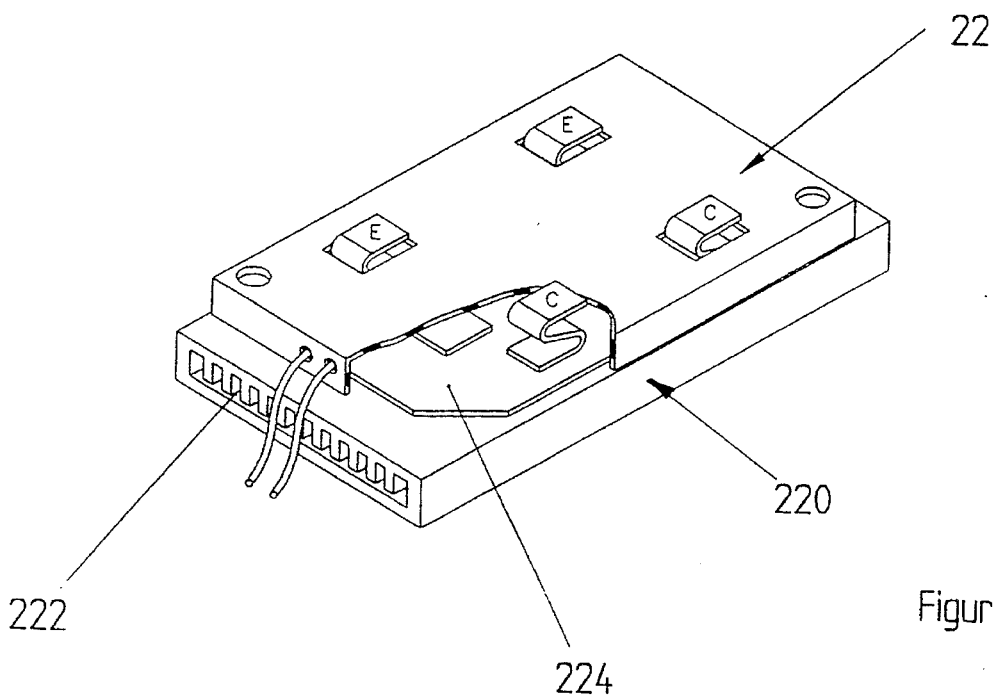
Figure 8A:
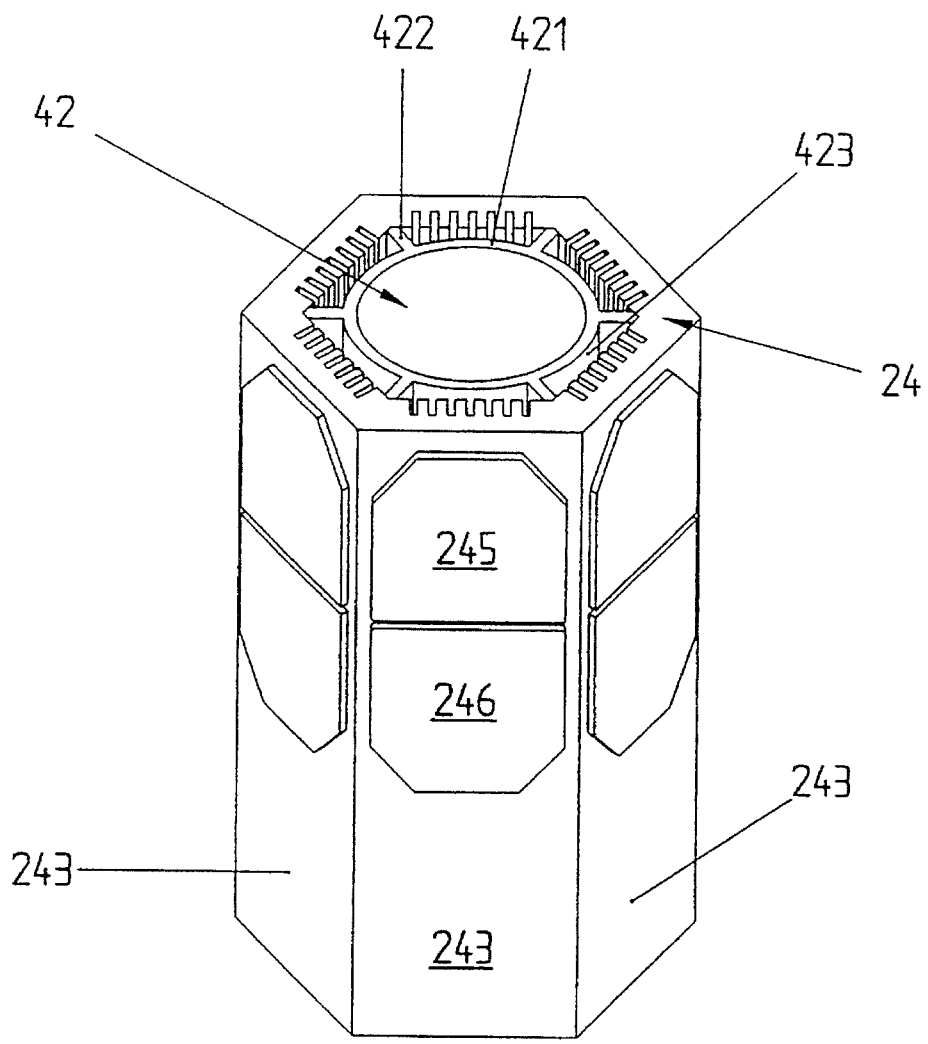
Figure 8B:
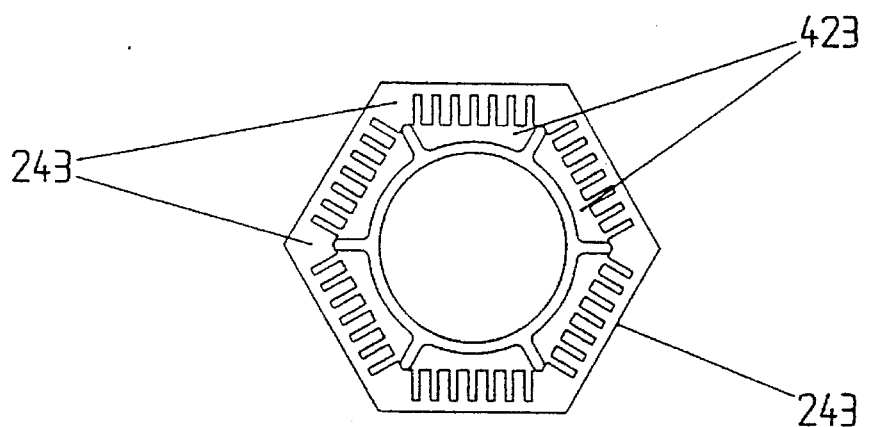
Figure 9A:
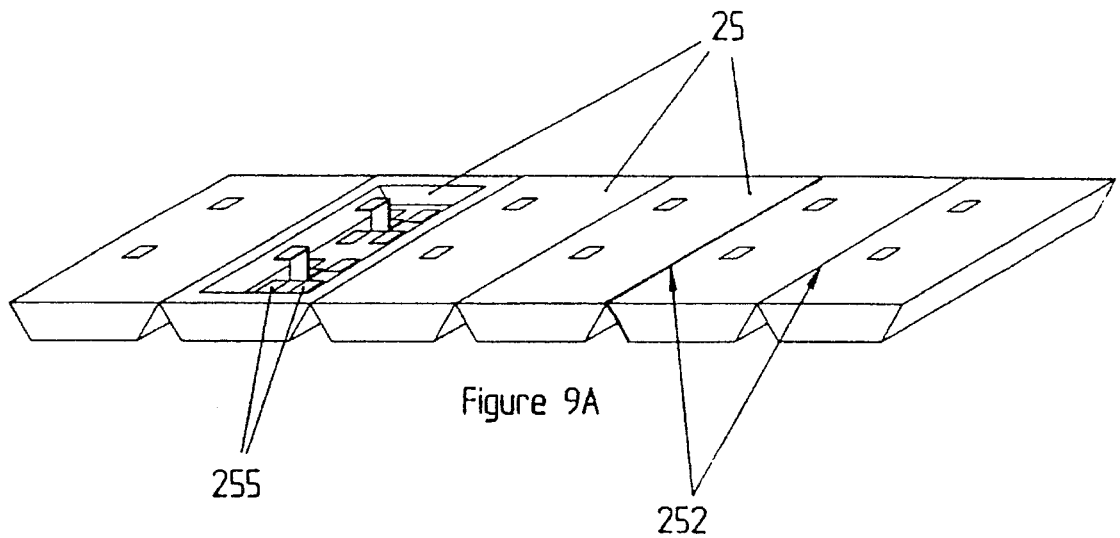
Figure 9B:
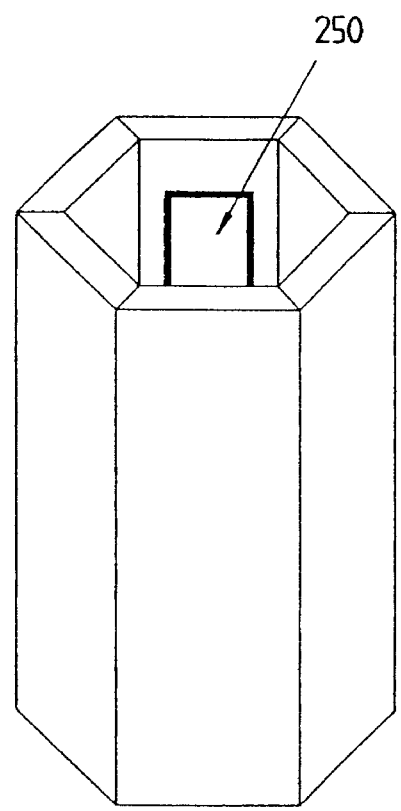
Figure 9C:
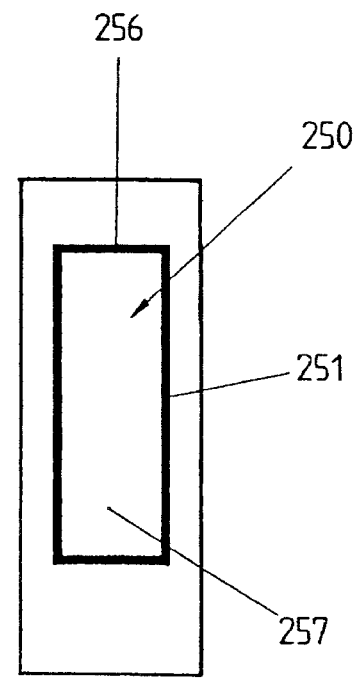

FIGS. 3A–E show various views, in third angle projection, of the interior of the assembly;

FIG. 4 illustrates, in isometric view, one of the individual modules used in making up the assembly of the previous figures;

FIGS. 5A to F show various views, in third angle projection, of the internal components of an alternative construction of the assembly;

FIG. 6 illustrates, in isometric view, an alternative construction of one of the individual modules which may used in making up a third, similar assembly;

FIGS. 7A to C show various views of component parts of a fourth example of assembly;

FIGS. 8A & 8B are an isometric view and an end view of components of a fifth example of assembly; and, FIGS. 9A, 9B & 9C are diagrammatic views of components of a sixth example of assembly.

The first example of an assembly 1, for a vehicle drive, and which is illustrated in FIGS. 1 through 4, comprises an arrangement of six identical modules 20 (shown in detail in FIG. 4), each of which has a copper heat sink substrate 200 formed by a first plate 201 having longitudinal grooves 202 and a second plate 203 covering the grooves, to form a plurality of fluid flow channels for coolant fluid, which may, depending upon the rated temperature for the semiconductors, be boiling water for example. On a first side of the module 20, bonded to the plate 201, are disposed a pair of, for example aluminium nitride or alumina mounting substrates 204, for the mounting of power semiconductor components 205 of the assembly. These latter components are not shown in detail as their arrangement on the substrates 204 and their construction do not form a part of the inventive aspect of the assembly, their location on the heat sink substrate 200, in such a way that heat can readily be removed through the substrate, being the main requirement. To connect the semiconductor components to busbars 101–105, solder terminations 206 are provided, by means of which the busbars may be soldered to the assembled modules. A plastic cover 207 shields the semiconductor components and drive wires 208 pass out through it. After assembling the cover, the interior can be filled with an insulating protective silicone gel.

On the other side of the module, mounted to the second copper plate 203 is a PCB 209 on which are disposed the electronic gate drive components (not shown) of the module.

The modules 20 are supported in the assembly I at their ends in respective manifolds 30 (see FIGS. 3A to 3E from which detail has been omitted for clarity), each of which comprises a generally hexagonal (in this example) main body part 300 formed with an inlet or outlet 301 and with manifold passages 302 for the flow of coolant to or from the passages 202 in the modules 20. In the example shown, each of the manifolds has a cover plate 303 to close the end of the manifold.

Output cables 106–108 take drive current from the busbars to the traction electric motor (not shown) as described in our international patent application no. PCT/GB92/01435 (WO93/02887).

A current sensor 109 is provided to sense current flow in an arm of the busbar 105 and a PCB connection 110 provides for interconnection of the gate drive PCB-mounted components to other PCBs of the power drive.

In use, the power drive assembly i is mounted with associated electrical and electronic components disposed around it in a compact volume and the output cables 106–108 extend to the location of the motor. Liquid coolant is caused to flow in through an inlet 301 of a first of the manifolds 30, through the passages 302, 202 & 302, and then out through the outlet 301 of the other manifold 30. The means of causing the coolant flow forms no part of the present invention.

In an alternative construction which may be desirable in some circumstances, the internal component parts are shown generally in FIGS. 5A to 5F, the modules 21 include a double cavity copper or aluminium extrusion heat sink manifolds 31,32 and coolant flows both in to and out of one of the manifolds 31, with the second manifold 32 acting merely to cause coolant to flow from a first of the passages 212, to a second 213 passage. In this particular example, the gate drive PCB 219 is mounted on the outer face of the heat sink extrusion 210, below the semiconductor component substrates 214.

A third form of module 22 is shown in FIG. 6 and is substantially similar to that of the first example, but is formed with a heat sink substrate comprising a single copper extrusion 220 to provide a coolant passage 222. The gate drive PCB is mounted separately in this case, but it will readily be appreciated that it could be mounted in alignment with the substrates 224 as in the second example.

In the fourth embodiment (illustrated in FIGS. 7A to 7C), the semiconductor devices 235 are mounted on flat copper plates 230 of appropriate dimensions, the plates having elongate grooves 232 on their rear surfaces and edge tongues 233 and groves 234. Advantageously, the plates can be nickel plated for corrosion resistance and electrical performance. The plates are interlocked by interengagement of the tongues and grooves around a central, generally cylindrical core or gasket 42 which has a cylindrical centre portion 421 and radial flanges 422. The core or gasket is preferably formed of a suitable compliant material such as polypropylene, PTFE or a similar compound (chosen for temperature performance, creep and resistance to flaking), and also forms coolant flow channels 423 as illustrated in FIG. 7C.

The above constructions have several advantages. Firstly, the use of copper as the substrate for the semiconductor devices (made possible by recently developed methods for mounting silicon on copper) increases heat conduction away from the semiconductors and thus allows reduced dimensions of the plates and improvements in thermal performance. Reduced semiconductor operating temperatures can be achieved therefor for a given coolant inflow temperature.

The support structure can also be extended to provide the housing for control electronics associated with the power devices, and to hold other components. Where the support structure is electrically insulating, the possibility exists, where the coolant is a non-ionic fluid, of utilising the plates as high current conductors, thereby reducing the amount of material and the number of assembly operations needed in the construction of the power converter.

The fifth example shows a hollow, hexagonal, aluminium body 24 which forms a primary heat sink and into which is directed, in use, a flow of cooling fluid. On the faces 243 of the heat sink body are mounted power semiconductor substrates 245 and anti-parallel diode substrates 246, symmetrically on each of the faces. The faces of the hexagonal prismatic body provide the substrates for the semiconductors and additionally provide substrates for gate drive circuits below. The components may be mounted on thin polyimide layers to provide an insulating separator.

In use, fluid is pumped around the inside of the prismatic body, being guided therein by an internal core or the like, which may be a simple star-shaped cross-section member, and fluid which has been heated in use can be used for preheating of an auxiliary internal combustion engine or the interior heating of a vehicle (as described in our international patent application PCT/GB92/01434 (WO93/02884).

Alternatively, particularly if a degree of "swirl" is required in order to improve heat transfer, a simpler structure may be possible.

While producing the prismatic substructure from copper, aluminium or other material as a single piece has several advantages, the necessity for processing a prismatic heat sink substructure requires modifications to power semiconductor processing equipment that is principally designed for handling flat plates. Thus incorporating flat plates, as described in the first four examples, into a prismatic structure has all the benefits described above, but also overcomes the need to modify the manufacturing/assembly machinery.

FIGS. 9A to 9C illustrate, diagrammatically, another way in which the assembly may be formed. The semiconductor electronic components 255 may be mounted to respective copper heat sink substrates 250 which are disposed in recesses 251 formed in the underside (as seen in FIG. 9A) of plastics support members 25 which are integrally formed and interconnected by hinge portions 252. The recesses are of larger peripheral extent than the heat sink substrates in order to allow for expansion, such expansion being accommodated by a flexible seal, for example a silicone gel 256. The underside of the heat sink substrates are then plated or otherwise covered with an insulating layer 257 (to avoid conduction to coolant). The plastics support members can then be folded up into a hexagonal prismatic form as seen in FIG. 9B.

The assemblies illustrated and described above provide a very compact and highly symmetrical structure which reduces the separation between individual components, thus reducing conductor lengths and in turn reducing inductances which further enables a reduction in size of the components.

We claim:

1. A mounting assembly for power semiconductors, the assembly comprising:

a plurality of plate-like modules arranged around a central axis, each module comprising;

at least two walls, at least one of said walls defining a flat major surface providing a heat sink for the direct mounting of semiconductor components thereon; and an internal passage defined between said walls for the passage of a fluid cooling medium therethrough in order to cool semiconductor components mounted on said surface.

2. An assembly according to claim 1, wherein each of said walls has a contoured rear surface, disposed radially inwardly into the respective passage, so as to provide an increased surface area over which coolant may flow in order to increase cooling.

3. An assembly according to claim 2, wherein the contours are in the form of grooves which extend in the direction of said axis.

4. An assembly according to claim 1, wherein the modules are interlocked directly to one another.

5. An assembly according to claim 1, wherein the assembly is substantially hexagonal in cross-section.

6. An assembly according to claim 1, wherein each module has two said walls which each define respective flat major surfaces providing a heat sink for the direct mounting of semiconductor components thereon, one of said walls being provided on each side of said module.

7. An assembly according to claim 6, further comprising electronic components mounted on each side of each module.

8. An assembly according to claim 6, wherein each module comprises an extrusion.

9. An assembly according to claim 6, wherein the flat major surfaces of each module are parallel to each other and the modules are cylindrically arranged in axial alignment about a central axis parallel to each of said flat surfaces.

10. An assembly according to claim 1, wherein the walls are copper.

11. An assembly according to claim 1, further comprising a pair of end manifolds, said manifolds being adapted to retain said modules and for feeding coolant fluid to and from the internal passages in said modules.

12. An assembly according to claim 1, wherein each module comprises an extrusion having a pair of passages defined therethrough.

13. An assembly according to any of claim 1, wherein the modules are interconnected along their adjacent edges.

14. An assembly according to claim 1, further comprising a central core disposed within said arrangement of modules, in supporting relation thereto.

15. An assembly according to claim 14, wherein the core is substantially cylindrical, said core having a number of radial flanges.

* * * * *